(12) United States Patent
Uang et al.

(10) Patent No.: US 8,802,557 B2
(45) Date of Patent: Aug. 12, 2014

(54) MICRO BUMP AND METHOD FOR FORMING THE SAME

(71) Applicant: Industrial Technology Research Institute, Hsinchu (TW)

(72) Inventors: Ruoh-Huey Uang, Zhudong Township (TW); Yi-Ting Cheng, Kaohsiung (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 13/851,833

(22) Filed: Mar. 27, 2013

(65) Prior Publication Data

US 2013/0217224 A1 Aug. 22, 2013

Related U.S. Application Data

(62) Division of application No. 13/098,209, filed on Apr. 29, 2011, now Pat. No. 8,426,964.

(51) Int. Cl.
*H01L 21/44* (2006.01)

(52) U.S. Cl.
USPC .... 438/615; 438/584; 438/662; 257/E21.158; 257/E23.068; 977/700; 977/773

(58) Field of Classification Search
USPC ............ 438/99, 478, 662; 257/40, 737, 257/E21.158, E23.068; 977/773
See application file for complete search history.

(56) References Cited

U.S. PATENT DOCUMENTS

| 2007/0218657 | A1* | 9/2007 | Bet et al. | 438/479 |
| 2010/0320442 | A1* | 12/2010 | Reddy | 257/13 |
| 2011/0097543 | A1* | 4/2011 | Lalli et al. | 428/141 |

OTHER PUBLICATIONS

Irradiation of supported gold and silver nanoparticles withcontinuous-wave, nanosecond and femtosecond laser light: a comparative study F. Hubenthala, M. Alschingera, M. Bauerb, D. Blazquez Sancheza, N. Borga, M. Brezeanua, R. Freseb, C. Hendricha, B. Krohna, M. Aeschlimannb, and F. Trager. Proc. SPIE 5838, Nanotechnology II, 224 (Jun. 28, 2005).*

* cited by examiner

*Primary Examiner* — Charles Garber
*Assistant Examiner* — Abdulfattah Mustapha
(74) *Attorney, Agent, or Firm* — Finnegan, Henderson, Farabow, Garrett & Dunner, LLP

(57) ABSTRACT

A method for forming a micro bump includes forming a first nano-particle layer on a substrate and forming a second nano-particle layer on the first nano-particle layer. The first and second nano-particle layers include a plurality of first nano particles and a plurality of second nano particles, respectively. The method further includes irradiating a laser beam onto the second nano-particle layer, where the laser beam penetrates through the second nano-particle layer and is at least partially absorbed by at least some of the first nano particles to generate heat. The first nano particles and the second nano particles have different absorption rates with respect to the laser beam.

11 Claims, 5 Drawing Sheets

MICRO BUMP AND METHOD FOR FORMING THE SAME

RELATED APPLICATION

This is a division of application Ser. No. 13/098,209, filed Apr. 29, 2011, the entire contents of which are incorporated herein by reference.

TECHNOLOGY FIELD

The present disclosure relates to semiconductor device manufacturing and, more particularly, to a micro bump, a method for forming the micro bump, and a package comprising the micro bump.

BACKGROUND

With the development of semiconductor technology, three-dimensional (3D) packaging has become more widely used. An integrated circuit employing 3D packaging technology may be called a 3D-IC. In a 3D-IC, chips may be vertically stacked on top of each other, with different chips being interconnected using interconnects such as through-silicon-vias (TSVs), bumps, and/or redistribution layers.

Among different kinds of 3D-ICs, those having logic chips and memory chips stacked in one package may be challenging to manufacture. Since there are many TSVs in such a 3D-IC, a large number of bumps may also be required to connect the TSVs in one chip and wirings on another chip. However, since chip area may be limited, the large number of bumps may require reducing a horizontal size of the bumps, such as a diameter of a circular bump, a side length of a square bump, or a length of a short side of a rectangular bump. The horizontal size of the bumps may need to be reduced to about 10 μm or even smaller. The traditional method of manufacturing lead-free solder bumps by a printing process may not be suitable for manufacturing bumps of such size.

Generally, a 3D-IC packaging process may require low temperature (such as a temperature lower than about 200° C.), low pressure (such as a pressure lower than 10 MPa), and non-vacuum condition during bonding of two chips. Moreover, bumps between the chips may need to have high strength and low resistivity. Currently, there are two categories of bonding methods that may be used for 3D-IC packaging. One is solder bonding, and the other is thermocompression bonding using copper bumps. However, the existing techniques cannot achieve a bump having a horizontal size of about 10 μm or smaller, which may be used to bond two chips at a bonding temperature lower than 200° C. and a bonding pressure smaller than 10 MPa in a non-vacuum environment. For example, use of SnAgCu solder can only achieve a bump having a horizontal size larger than 25 μm. Solder bonding using CuSn solder may be used to manufacture bumps having smaller size, but the temperature required for bonding using CuSn solder may need to be higher than 250° C. The thermocompression bonding method using copper bumps may need a higher temperature of about 400° C., a pressure higher than 10 MPa, and a vacuum environment. Also, a 3D-IC packaged using thermocompression bonding method may have large stresses built up in the chips. This may be especially true for an IC package composed of chips with small thickness and the stresses may cause the chips to crack.

Recently, metal nano particles have been employed as bonding material for microelectromechanical systems (MEMS), surface mount diodes (SMD), and light emitting devices (LED). Due to their small size, metal nano particles may have a low melting temperature, so that the bonding process using metal nano particles may be performed at a low temperature. However, in most existing methods, metal nano particles are coated on chips in a form of paste or ink, These methods may not be able to form micro bumps having a horizontal size smaller than 10 μm, and thus may also not be suitable for the fabrication of a 3D-IC including logic and memory chips.

Further, since space exists between metal nano particles due to, for example, non-uniform nano-particle size and protective agents such as polyvinylpyrrolidone (PVP), if the metal nano particles are directly subjected to a bonding process, voids may appear in the bumps so formed. For micro bumps having a horizontal size smaller than 10 μm, such voids may undesirably decrease bond strength. The resistivity of the micro bumps may also increase due to the voids. To prevent voids from forming, the metal nano particles may be first melted and solidified, and then subjected to the bonding process. However, in this method, since the melting/solidifying process may cause formation of larger crystal grains, the temperature required for bonding may be increased.

SUMMARY

In accordance with the present disclosure, there is provided a method for forming a micro bump including forming a first nano-particle layer on a substrate and forming a second nano-particle layer on the first nano-particle layer. The first and second nano-particle layers include a plurality of first nano particles and a plurality of second nano particles, respectively. The method further includes irradiating a laser beam onto the second nano-particle layer, the laser beam penetrating through the second nano-particle layer and being at least partially absorbed by at least some of the first nano particles to generate heat. The first nano particles and the second nano particles have different absorption rates with respect to the laser beam.

Also in accordance with the present disclosure, there is provided a method for forming a micro bump including forming a first nano-particle layer on a substrate, patterning the first nano-particle layer to form a plurality of adhesion pads, and forming a second nano-particle layer over the adhesion pads and the substrate. The first and second nano-particle layers include a plurality of first nano particles and a plurality of second nano particles, respectively. The method further includes irradiating a laser beam onto the second nano-particle layer, the laser beam penetrating the second nano-particle layer and being at least partially absorbed by the first nano particles in the adhesion pads to generate heat. The first nano particles and the second nano particles have different absorption rates with respect to the laser beam.

Also in accordance with the present disclosure, there is provided a micro bump including an adhesion layer formed of a first metal and a bump layer formed on the adhesion layer. The bump layer includes a plurality of nano particles formed of a second metal and a filling material filling space between the nano particles, the filling material being formed of the first metal. A weight ratio of the filling material to the nano particles decreases from an interface between the bump layer and the adhesion layer to a top surface of the bump layer.

Also in accordance with the present disclosure, there is provided a package including a first substrate comprising a first electrode, a second substrate comprising a second electrode, a first adhesion layer formed on the first substrate, and a second adhesion layer formed on the second substrate. The first and second adhesion layers are formed of a first metal. The package also includes a bump layer formed between the first adhesion layer and the second adhesion layer. The bump layer includes a bump material and a filling material filling space in the bump material. The bump material is formed of a second metal and the filling material is formed of the first metal. A weight ratio of the filling material to the bump material decreases from an interface between the bump layer and the first adhesion layer to a middle of the bump layer, and increases from the middle of the bump layer to an interface between the bump layer and the second adhesion layer.

Features and advantages consistent with the present disclosure will be set forth in part in the description which follows, and in part will be obvious from the description, or may be learned by practice of the present disclosure. Such features and advantages will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate several embodiments of the invention and together with the description, serve to explain the principles of the invention.

DESCRIPTION OF THE EMBODIMENTS

Embodiments consistent with the present disclosure include methods for forming micro bumps, micro bumps so formed, and electronic packages having such micro bumps.

Hereinafter, embodiments consistent with the present disclosure will be described with reference to drawings. Wherever possible, the same reference numbers will be used throughout the drawings to refer to the same or like parts.

Figure 1A:
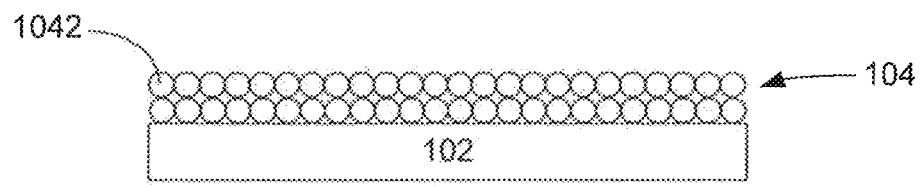
FIGS. 1A-1E are schematic cross-sectional views showing a method for forming micro bumps according to embodiments consistent with the present disclosure.

FIGS. 1A-1E schematically show a method for forming micro bumps consistent with embodiments of the present disclosure. FIG. 1A shows a first nano-particle layer 104 formed on a substrate 102. The substrate 102 may be, for example, a semiconductor substrate, a polyimide substrate, or a metal substrate. The first nano-particle layer 104 includes a plurality of first nano particles 1042. In some embodiments, the first nano particles 1042 may have a size less than 50 nm. As used herein, a size of a nano particle may refer to a diameter of the nano particle if it has an approximately spherical shape, or may refer to a length at a longest dimension of the nano particle if it has a shape other than spherical or an irregular shape. In some embodiments, the size of each first nano particle 1042 may be about 10 nm to about 30 nm. In some embodiments, the first nano-particle layer 104 may have a thickness of about 100 nm to about 1000 nm. In some embodiments, the first nano-particle layer 104 may have a thickness of about 700 nm.

In some embodiments, the first nano-particle layer 104 may be formed by coating a first solution on the substrate 102, where the first solution includes a solvent and a plurality of the first nano particles 1042. In some embodiments, the solvent in the first solution may be water. In some embodiments, the solvent in the first solution may be alcohol, such as methanol, ethanol, isopropyl alcohol (IPA), or butanol. After the first solution is coated on the substrate 102, the solvent is evaporated so that the first nano particles 1042 remain on the substrate 102 to form the first nano-particle layer 104.

Figure 1B:
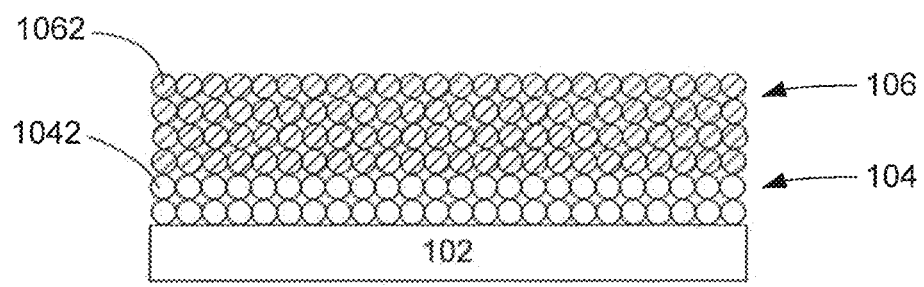

Next, as shown in FIG. 1B, a second nano-particle layer 106 including a plurality of second nano particles 1062 is formed on the first nano-particle layer 104. In some embodiments, a size of the second nano particles 1062 may be several nanometers to several thousands of nanometers. In some embodiments, the size of each second nano particle 1062 may be about 20 nm to about 300 nm. In some embodiments, the second nano-particle layer 106 may have a thickness of about 1 μm to about 10 μm.

In some embodiments, the second nano-particle layer 106 may be formed by coating a second solution on the first nano-particle layer 104, where the second solution includes a solvent and a plurality of second nano particles 1062. In some embodiments, the solvent in the second solution may be water. In some embodiments, the solvent in the second solution may be alcohol, such as methanol, ethanol, isopropyl alcohol (IPA), or butanol. After the second solution is coated on the first nano-particle layer 104, the solvent is evaporated so that the second nano particles 1062 remain on the first nano-particle layer 104 to form the second nano-particle layer 106.

In some embodiments, since the first nano particles 1042 may also dissolve in the solvent in the second solution containing the second nano particles 1062, some of the deposited first nano particles 1042 may be dissolved and mixed into the second solution. Therefore, after the second nano-particle layer 1062 is formed, some first nano particles 1042 may be included in the second nano-particle layer 106. In some embodiments, besides the solvent and the second nano particles 1062, the second solution may be composed to also include a plurality of the first nano particles 1042. In such a case, the second nano-particle layer 106 would include a mixture of the first nano particles 1042 and the second nano particles 1062.

Figure 1C:
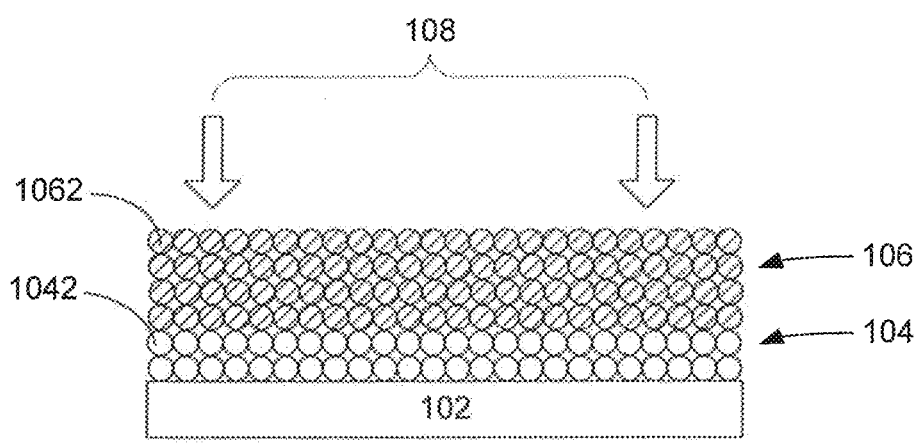

Referring to FIG. 1C, after the second nano-particle layer 106 is formed, a laser beam 108 is irradiated onto the second nano-particle layer 106. In some embodiments, a single laser source may be used to scan over the second nano-particle layer 106 and irradiate laser beam 108 onto regions where micro bumps are to be formed. In some embodiments, an array of laser sources may be used to irradiate a plurality of laser beams 108 at the same time. For illustrative purposes, FIG. 1C shows two laser beams 108. This should be understood to be one laser beam irradiating at different times or two or more laser beams irradiating at the same time.

In some embodiments, the second nano particles 1062 may not absorb the laser beam 108 or may have a very small absorption rate of the laser beam 108, while the first nano particles 1042 may have a larger absorption rate of the laser beam 108 as compared to the second nano particles 1062. Thus, most of the laser beam 108 may penetrate through the second nano-particle layer 106, and be absorbed by at least some of the first nano particles 1042 in the first nano-particle layer 104. That is, at least some of the first nano particles 1042 in the first nano-particle layer 104 may absorb at least part of the laser energy to generate heat and thus be melted. In some embodiments, the heat generated by some of the first nano particles 1042 may be partially transferred to neighboring nano particles and cause them to melt as well, In addition, in the case of the second nano-particle layer 106 also including some first nano particles 1042, at least some of the first nano particles 1042 in the second nano-particle layer 106 may also absorb part of the laser energy and be melted.

As used herein, the word "melt" may mean either completely melt or partially melt. For example, the first nano particles 1042 irradiated by the laser beam 108 may be completely melted, or only a surface portion of the particles be melted.

To selectively heat and melt the first nano particles 1042 but keep the second nano particles 1062 essentially unmelted, technologies such as surface plasmon resonance (SPR) absorption may be employed. In general, a metal may absorb energy of a laser beam via surface plasmon resonance (SPR) absorption. The absorption rate of the metal may depend on several factors such as a wavelength of the laser beam and a state of the metal (e.g., a size of the metal particles). Holding other factors constant, when the wavelength of the laser beam equals a certain wavelength, the absorption rate of a metal in a certain state may be at its maximum. This certain wavelength is called an SPR wavelength of the metal for that certain state. As a difference between the wavelength of the laser beam and the SPR wavelength of the metal increases, a capability of the metal to absorb the energy of the laser beam decreases. Different metals may have different SPR wavelength. Therefore, when two metals having different SPR wavelengths are irradiated by a laser beam having a wavelength consistent with the SPR wavelength of one metal, the one metal may absorb most of the laser energy and melt. The other metal may only absorb a very small amount of the laser energy, or may essentially absorb no laser energy, and thus is essentially unchanged by the laser beam.

For example, silver (Ag) and copper (Cu) have different SPR wavelengths. As an example, for Ag nano particles having a size equal to or larger than about 25 nm, the SPR wavelength may be about 405 nm. The full-width-half-height (FWHM) of an absorption spectrum of such Ag nano particles may be about 126 nm, with a wavelength range being from about 363 nm to about 489 nm. As another example, for Ag nano particles having a size equal to or smaller than about 20 nm, the SPR wavelength may be about 400 nm. The FWHM of an absorption spectrum of such Ag nano particles may be about 65 nm, with a wavelength range being from about 375 nm to about 440 nm. Similarly, as a further example, for Cu nano particles having a size between about 50 nm to about 200 nm, the SPR wavelength may be about 600 nm. The FWHM of an absorption spectrum of such Cu nano particles may be about 192 nm, with a wavelength range being from about 557 nm to about 750 nm.

Therefore, in some embodiments consistent with the present disclosure, the first nano particles 1042 and the second nano particles 1062 may be Ag nano particles and Cu nano particles, respectively, and the laser beam 108 may have a wavelength close to the SPR wavelength of the Ag nano particles and significantly different from the SPR wavelength of the Cu nano particles. In some embodiments, the SPR wavelength of Ag nano particles may be from about 390 nm to about 410 nm. The SPR wavelength of Cu nano particles may be from about 590 nm to about 610 nm. In some embodiments, the SPR wavelength of Ag nano particles may be about 410 nm, and the SPR wavelength of Cu nano particles may be about 590 nm. In some embodiments, the wavelength of the laser beam 108 may be within a range from about 400 nm to about 410 nm. In some embodiments, the wavelength of the laser beam 108 may be about 405 nm. In some embodiments, the laser beam 108 may be generated by, for example, a semiconductor laser, such as a GaN-based semiconductor laser.

In some embodiments, the first nano particles 1042 and the second nano particles 1062 may be gold (Au) and Cu, respectively, and the laser beam 108 may have a wavelength close to the SPR wavelength of the Au nano particles and significantly different from the SPR wavelength of the Cu nano particles. The SPR wavelength of Au nano particles may be from about 470 nm to about 520 nm. In these embodiments, the wavelength of the laser beam 108 may be chosen to be within a range from about 530 nm to about 540 nm. For example, in some embodiments, the wavelength of the laser beam 108 may be about 532 nm.

The SPR wavelength of nano particles may not only depend on the material forming the nano particles, but may also depend on the size of the nano particles. For example, for copper nano particles having different sizes, the SPR wavelengths may be different. Therefore, in some embodiments of the present disclosure, the first nano particles 1042 and the second nano particles 1062 may be formed of the same material, such as copper, but may have different sizes. In such embodiments, for example, the size of the copper nano particles in the first nano-particle layer 104 may be from about 10 nm to about 30 nm, while the size of the copper nano particles in the second nano-particle layer 106 may be from about 50 nm to about 300 nm. In these embodiments, the wavelength of the laser beam 108 may be chosen to correspond to one of the two kinds of copper nano particles having different sizes. For example, the wavelength of the laser beam 108 may be from about 590 nm to about 595 nm. As an example, the wavelength of the laser beam 108 may be about 593 nm.

The first and second nano particles 1042 and 1062 may be coated with a protective agent, to prevent aggregation of the nano particles. For different nano particles, the protective agent may be different. For example, for Ag nano particles, the protective agent may be polyvinylpyrrolidone (PVP), polyacrylic acid (PAA), polyethylene glycol, alkyl amine (oleyl amine), or alkyl thiol. For Cu nano particles, the protective agent may be PVP, alkyl amine (oleyl amine), or alkyl thiol. Nano particles coated with different protective agents may be dissipated in different solutions. For example, nano particles coated with PAA and polyethylene glycol may be dissipated in water, while nano particles coated with alkyl amine (oleyl amine) or alkyl thiol may be dissipated in toluene or teradecane.

The content of the protective agent coating the nano particles may also be different for different nano particle sizes. For example, if the Ag nano particles consisting of the first nano particles 1042 have a size equal to or larger than about 25 nm, the content of protective agent by weight may be about 4% to about 6%. For another example, if the Ag nano particles consisting of the first nano particles 1042 have a size equal to or smaller than about 20 nm, the content of protective agent by weight may be about 8% to about 10%.

Figure 1D:
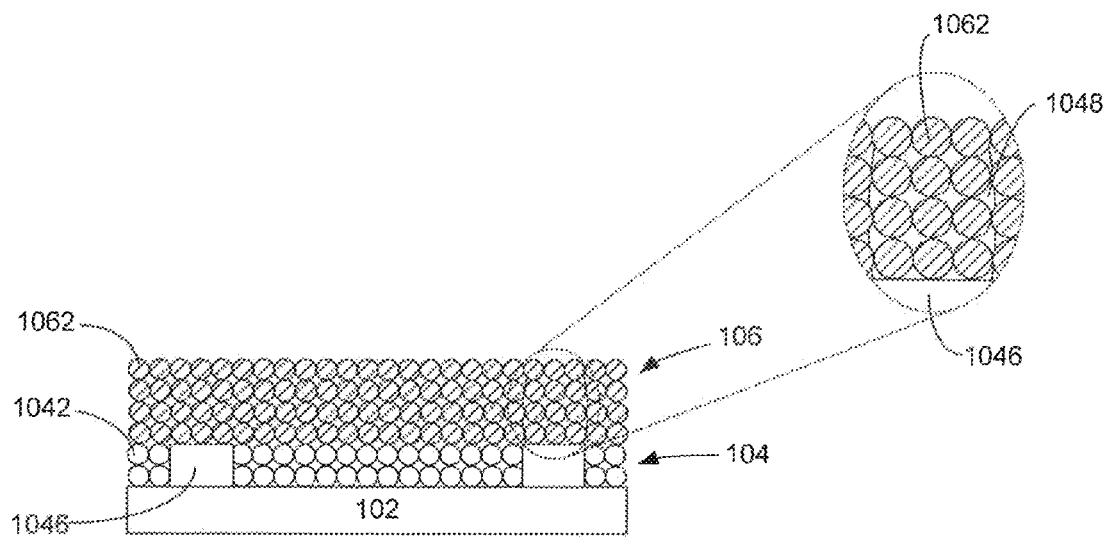

FIG. 1D shows that the first nano particles 1042 within regions irradiated by the laser beam 108 are selectively heated and melted. The melted first nano particles 1042 in the first nano-particle layer 104 solidify to form adhesion layers 1046. Part of the melted first nano particles 1042 enters the second nano-particle layer 106 and, after solidifying, serves as filling material 1048 filling space between the second nano particles 1062, as shown in the enlarged view of FIG. 1D. The filling material 1048 adheres to the second nano particles 1062. In addition, the melted first nano particles 1042 may also adhere to each other and adhere to the substrate 102.

Figure 1E:
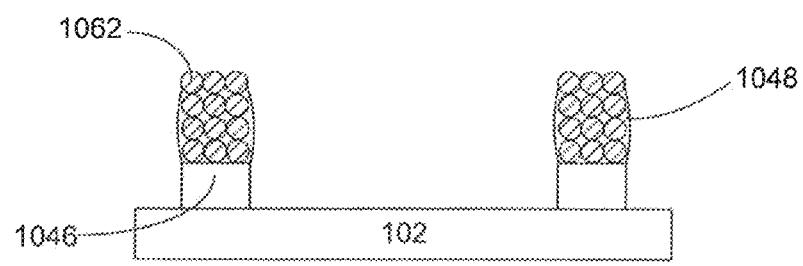

A cleaning solution is then used to remove the unmelted first nano particles 1042 and the unadhered second nano particles 1062. Since the second nano particles 1062 above the adhesion layers 1046 are adhered by the filling material 1048, they are not removed by the cleaning solution. After the treatment by the cleaning solution, the adhesion layers 1046, the second nano particles 1062 above the adhesion layers 1046, and the filling material 1048 are left on the substrate 102, forming micro bumps, as shown in FIG. 1E.

In the embodiments described with respect to FIGS. 1A-1E, the micro bumps are formed by irradiating with the laser beam 108 to melt part of the first nano particles 1042. The horizontal size of the micro bumps may be controlled by controlling a spot size of the laser beam 108 projected on the second nano-particle layer 106 to control a size of a region within which the first nano particles 1042 may melt. In some embodiments, the laser beam 108 may directly irradiate the second nano-particle layer 106, and the spot size of the laser beam 108 may be changed by using different laser sources. In some embodiments, the laser beam 108 may be projected onto the second nano-particle layer 106 through a lens. By using different lens or changing a distance between the lens and a top surface of the second nano-particle layer 106, the spot size of the laser beam 108 may be changed. In some embodiments, the spot size of the laser beam 108 may be smaller than about 10 μm, so that the as-formed micro bumps may have a horizontal size smaller than about 10 μm. In some embodiments, the spot size of the laser beam 108 may be larger than about 5 μm but smaller than about 10 μm, so that the as-formed micro bumps may have a horizontal size larger than about 5 μm but smaller than about 10 μm. In some embodiments, the spot size of the laser beam 108 may be about 10 μm, so that the as-formed micro bumps may have a horizontal size of about 10 μm. In some embodiments, the spot size of the laser beam 108 may be about 5 μm, so that the as-formed micro bumps may have a horizontal size of about 5 μm.

Figure 2A:
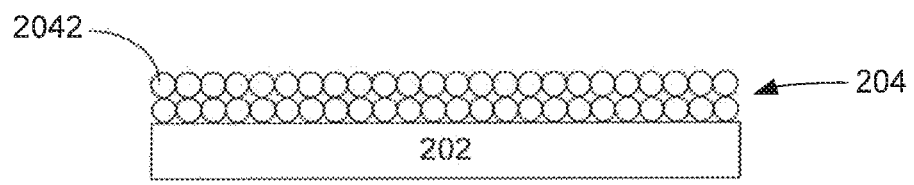
FIGS. 2A-2F are schematic cross-sectional views showing another method for forming micro bumps according to embodiments consistent with the present disclosure.

FIGS. 2A-2F schematically show another method for forming micro bumps consistent with embodiments of the present disclosure. Referring to FIG. 2A, similar to that shown in FIG. 1A, a first nano-particle layer 204 consisting of first nano particles 2042 is formed on a substrate 202. The method for forming the nano-particle layer 204 may be the same as that for forming the nano-particle layer 104, and thus is not described here.

Figure 2B:
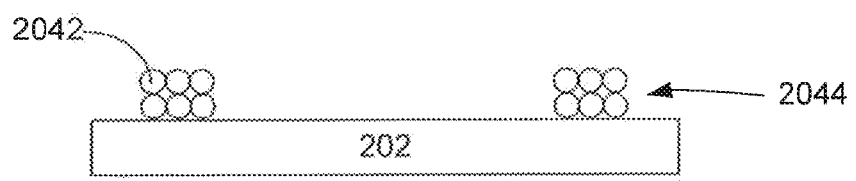

Next, as shown in FIG. 2B, the first nano-particle layer 204 is patterned to form adhesion pads 2044. In some embodiments, the first nano-particle layer 204 may be patterned by, for example, a photolithography process.

In some embodiments, bonding layers (not shown), such as copper, gold, silver, or nickel bonding layers, may have been formed on the substrate 202 before forming the first nano-particle layer 204. In these embodiments, the bonding layers may be formed by first forming a bonding material layer and then patterning the bonding material layer using, for example, a photolithography process. The patterning of the first nano-particle layer 204 may be performed by a self-alignment process which keeps the first nano particles 2042 deposited on the bonding layers to form the adhesion pads 2044 but removes the first nano particles 2042 deposited directly on the substrate 202.

In some embodiments, self-assembly monolayers may be formed on the bonding layers to assist the formation of the adhesion pads 2044. Self-assembly monolayer may improve the adhesion of the first nano particles 2042 to the bonding layers. In these embodiments, after patterning the bonding material layer to form the bonding layers, self-assembly monolayers may be formed on the bonding layers.

The material suitable for the self-assembly monolayers may have a head group and a functional end group. In such a material, a head group may be connected to an alkyl chain, where one end of the alkyl chain not connected to the head group may be functionalized (i.e., adding —OH, —NH3, or —COOH groups) to vary wetting and interfacial properties of the self-assembly monolayers. The functional end group may be selected from, but not be limited to, —OH, —CHO, —COOH, —SH, —CONH$_2$. The type of the head group depends on the application of the self-assembly monolayers. Surfaces on which head groups may be held may be planar surfaces, such as surfaces of silicon wafer and metal layers, or curved surfaces, such as surfaces of nanoparticles. Material suitable for self-assembly monolayers may be alkanethiols, disulfide, dialkyl disulfides, dialkyl sulfide, alkylxanthate, or dialkylthiocarbamate. Alkanethiols are molecules with an alkyl chain as the back bone, a tail group, and an S—H head group. They may be used on noble metal substrates because of the strong affinity of sulfur for these metals. For example, the material for the self-assembly monolayers may be HS—C$_n$H$_{2n}$—COOH (such as HS—C$_3$H$_6$—COOH), HS(CH$_2$)$_{16}$OH, HS(CH$_2$)$_{15}$CO$_2$CH$_3$, HS(CH$_2$)$_{15}$CH$_3$, HS(CH$_2$)$_{15}$COOH, HS(CH$_2$)$_{16}$SO$_4$H, HS(CH$_2$)$_9$CH$_3$, NH$_2$(CH$_2$)$_n$SH, HS(CH$_2$)$_{11}$CONH$_2$, or Si(OCH$_3$)$_3$—(CH$_2$)$_n$SH. The S—H head group in such material may form a covalent bond with the metal in the bonding layers so as to adhere the material to the bonding layers. On the other hand, since the S—H head group does not react with the substrate, the self-assembly monolayer material may not adhere to the substrate. Thus, the self-assembly monolayers may be formed on the bonding layers.

After forming the self-assembly monolayers on the bonding layers, nano particles 2042 are deposited. Some of the nano particles 2042 are deposited on the self-assembly monolayers and thus adhered thereto. Other nano particles 2042 not deposited on the self-assembly monolayers can be removed easily. Alternatively, in some other embodiments, material containing Si(OC$_n$H$_{2n+1}$)$_x$ (x=1~4) may be used as the material for the self-assembly monolayers. In these embodiments, the material for the self-assembly monolayers may form covalent bonds with silicon in the substrate so as to attach the material to the silicon substrate. In this way, the self-assembly monolayers may be formed on the exposed silicon substrate, rather than on the metal bonding layers. After that, the metal bonding layers may be removed and nano particles 2042 be deposited.

In some embodiments, the substrate 202 may be patterned to form a plurality of protruding portions before forming the first nano-particle layer 204. First nano particles 2042 may be deposited on and adhere to upper surfaces of the protruding portions of the substrate 202, forming the adhesion pads 2044 directly.

In some embodiments, the adhesion pads 2044 may have a horizontal size smaller than 10 μm.

Figure 2C:
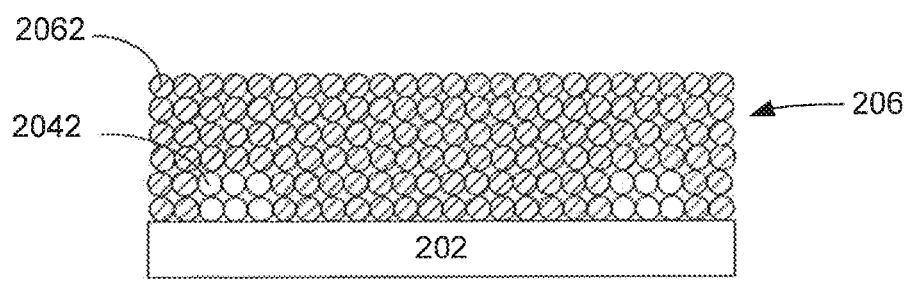

After the adhesion pads 2044 are formed, a second nano-particle layer 206 consisting of second nano-particles 2062 is formed over the adhesion pads 2044 and the substrate 202, as shown in FIG. 2C. The method for forming the nano-particle layer 206 may be the same as that for forming the nano-particle layer 106, and thus is not described here.

Figure 2D:
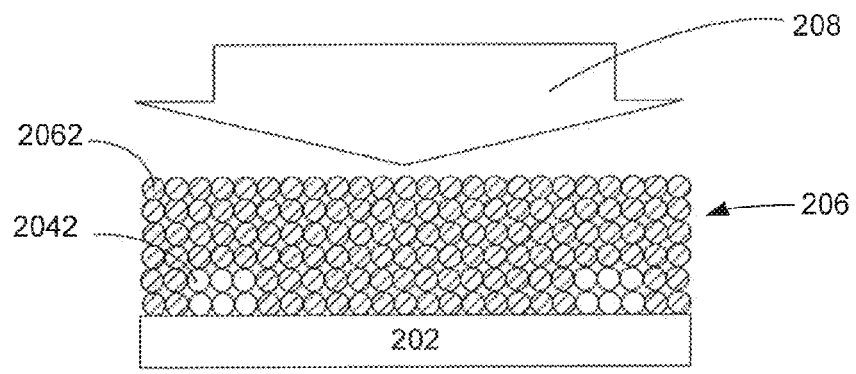

Referring to FIG. 2D, a laser beam 208 is then irradiated onto the second nano-particle layer 206 to selectively heat and melt the first nano particles 2042 in the adhesion pads 2044. In the process shown in FIG. 1C, since the horizontal size of the micro bumps is determined by the spot size of the laser beam 108, the spot size of the laser beam 108 may need to be controlled to be smaller than 10 μm to achieve micro bumps having horizontal size smaller than 10 μm. However, in the process shown in FIG. 2D, the horizontal size of the micro bumps is determined by the horizontal size of the adhesion pads 2044. Thus, it may not be necessary to control the spot size of the laser beam 208 to be smaller than 10 μm to achieve micro bumps having a horizontal size smaller than 10 μm. That is, the spot size of the laser beam 208 may be larger than the desired horizontal size of the micro bumps, and thus a spot of the laser beam 208 projected on the second nano-particle layer 206 may cover a plurality of adhesion pads 2044. Therefore, in the process shown in FIG. 2D, a laser beam having a relatively large diameter may be used and it may not be necessary to use a lens to converge the laser beam. As a result, the cost for generating the laser beam 208 may be reduced. For illustrative purposes, in FIG. 2D, the symbol for the laser beam 208 is shown to be larger than the symbol for the laser beam 108 in FIG. 10. This schematically indicates that the laser beam 208 may have a diameter larger than the horizontal size of the laser beam 108 in FIG. 1C.

Figure 2E:
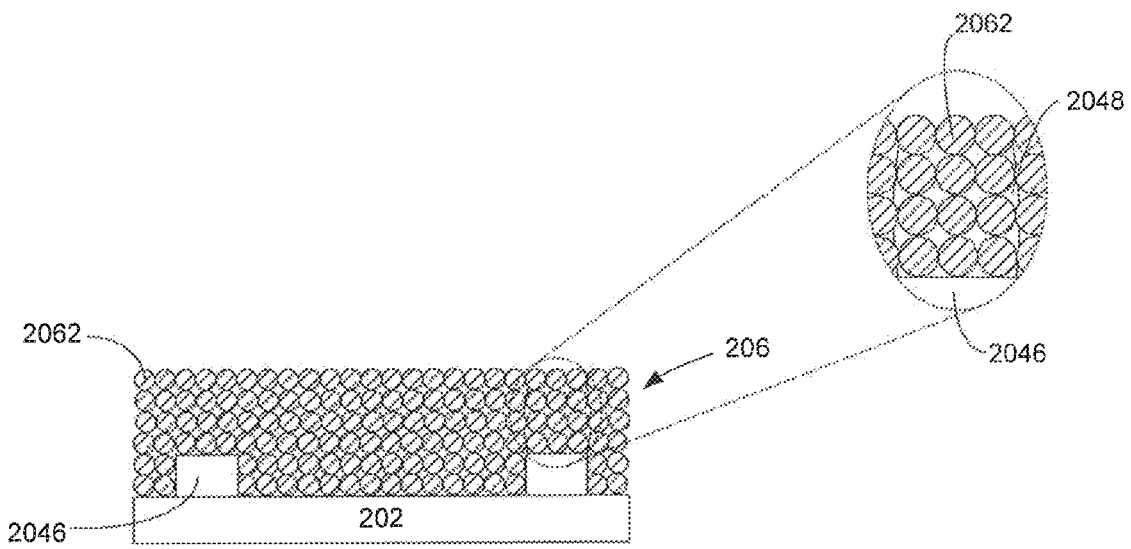

With reference to FIG. 2E, after the irradiation by the laser beam 208, the melted first nano particles 2042 in the adhesion pads 2044 solidify to form adhesion layers 2046. Part of the melted first nano particles 2042 enters into the second nano-particle layer 206 and, after solidifying, serves as filling material 2048 filling the space between the second nano particles 2062, as shown in the enlarged view of FIG. 2E, The filling material 2048 adheres to the second nano particles 2062 above each adhesion layer 2046.

Figure 2F:
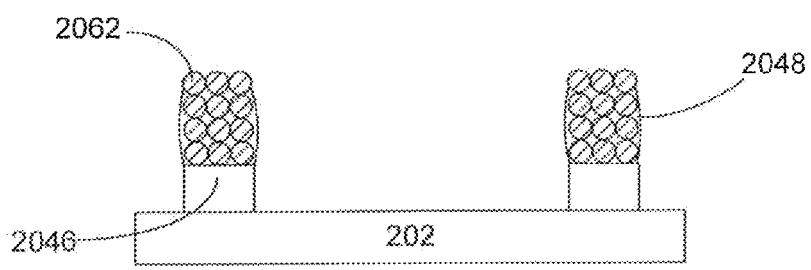

A cleaning solution is then applied to remove the unadhered second nano particles 2062. Thus, the adhesion layers 2046, the second nano particles 2062 above the adhesion layers 2046, and the filling material 2048 are left on the substrate 202, forming micro bumps, as shown in FIG. 2F.

In the method shown in FIG. 2A-2F, the first nano particles 2042 and the second nano particles 2062 may be the same as the first nano particles 1042 and the second nano particles 1062 in FIGS. 1A-1E, respectively. The thicknesses of the first nano-particle layer 204 and the second nano-particle layer 206 may also be the same as those of the first nano-particle layer 104 and the second nano-particle layer 106 in FIGS. 1A-1E, respectively. Therefore, description of properties of the first nano particles 2042, the second nano particles 2062, the first nano-particle layer 204, and the second nano-particle layer 206 is omitted.

Figure 3A:
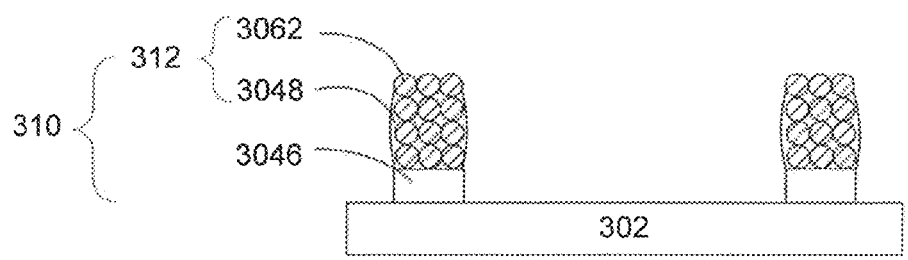
FIGS. 3A and 3B are a schematic cross-sectional view and a schematic plan view, respectively, showing micro bumps according to embodiments consistent with the present disclosure.
Figure 3B:
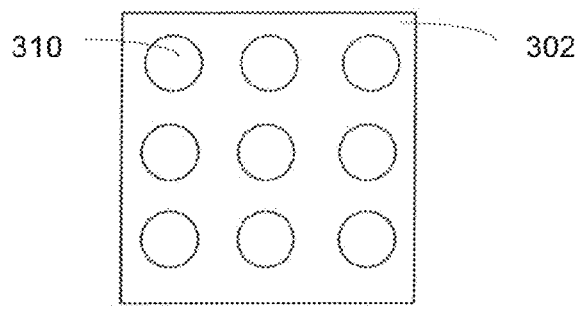

FIGS. 3A and 3B schematically show a chip having a substrate 302 and a plurality of micro bumps 310 formed on the substrate 302 using methods consistent with embodiments of the present disclosure. FIG. 3A is a cross-sectional view and FIG. 3B is a plan view. The structure shown in FIG. 3A is similar to those shown in FIG. 1E and FIG. 2F. In the plan view of FIG. 3B, the micro bumps 310 are illustrated to have a circular shape. In other embodiments, the micro bumps 310 may have another shape in the plan view, such as a square shape or a rectangular shape.

Consistent with embodiments of the present disclosure, the micro bump 310 includes an adhesion layer 3046 formed of a first metal material. The adhesion layer 3046 may have a thickness of, for example, about 100 nm to about 1000 nm. A bump layer 312 is formed on the adhesion layer 3046. The bump layer 312 includes a plurality of nano particles 3062 formed of a second metal material. The nano particles 3062 may have a size, such as diameter, of, for example, about 20 nm to about 300 nm. The bump layer 312 further includes a filling material 3048 formed of the first metal material. In these embodiments, the first metal material and the second metal material may be different metals. The filling material 3048 fills a space between the nano particles 3062 and adhere to the nano particles 3062. In some embodiments, the filling material 3048 may fill the space between the nano particles 3062 in a manner such that there is essentially no void formed in the bump layer 312.

Consistent with embodiments of the present disclosure, a weight ratio of the filling material 3048 to the nano particles 3062 may decrease from an interface between the bump layer 312 and the adhesion layer 3046 to a top surface of the bump layer 312. In some embodiments, this ratio may be about 150:1 to about 10:1 near an interface between the bump layer 312 and the adhesion layer 3046. In some embodiments, this ratio may be about 100:1 to about 20:1 near an interface between the bump layer 312 and the adhesion layer 3046. In some embodiments, this ratio may decrease to about 1:1 to about 1:20 near a top surface of the bump layer 312. For example, the weight ratio of the filling material 3048 to the nano particles 3062 may be about 1:20 near the top surface of the bump layer 312. The change of weight ratio is primarily due to a corresponding change in the packing density of the nano particles.

In some embodiments, an amount of the filling material 3048 may decrease from the interface between the bump layer 312 and the adhesion layer 3046 to the top surface of the bump layer 312.

Consistent with embodiments of the present disclosure, the first and second metal materials may be different metals. For example, the first metal material may be silver and the second metal material may be copper. In some embodiments, the first and second metal materials may be the same metal, such as copper. However, as previously explained, when the first and second metal materials are the same, a size of nano particles used to form the filling material 3048 may be different from a size of the nano particles 3062.

Figure 4:
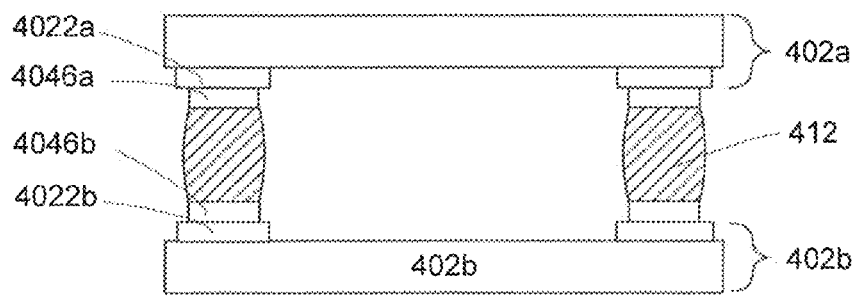
FIG. 4 is a schematic cross-sectional view showing a package according to embodiments consistent with the present disclosure.

FIG. 4 schematically shows a package formed by bonding two integrated circuit chips in a face-to-face manner using micro bumps consistent with embodiments of the present disclosure. The package comprises a first substrate 402a of a first chip and a second substrate 402b of a second chip. The first substrate 402a and the second substrate 402b include first electrodes 4022a and second electrodes 4022b, respectively. On the first electrodes 4022a and the second electrodes 4022b are formed first adhesion layers 4046a and second adhesion layers 4046b, respectively, The first adhesion layers 4046a and the second adhesion layers 4046b are formed of a first metal material. Bump layers 412 are formed between the first adhesion layers 4046a and the second adhesion layers 4046b.

Consistent with embodiments of the present disclosure, the bump layers 412 may include a bump material as a major component of the bump layers 412. The bump material may be formed of a second metal material. The bump layers 412 may further include a filling material formed of the first metal material. The filling material may fill a space in the bump material and adhere to the bump material. In some embodiments, the filling material and the bump material may be mixed in a manner such that there is essentially no void formed in the bump layers 412.

Consistent with embodiments of the present disclosure, a weight ratio of the filling material to the bump material may decrease from an interface between the bump layers 412 and the adhesion layers 4046a to a middle of the bump layers 412, and increases from the middle of the bump layers 412 to an interface between the bump layers 412 and the adhesion layers 4046b. As previously explained, the change in weight ratio may be primarily due to a corresponding change in the packing density of the nano particles.

In some embodiments, an amount of the filling material may decrease from the interface between the bump layers 412 and the adhesion layers 4046*a* to a middle of the bump layers 412, and increases from the middle of the bump layers 412 to the interface between the bump layers 412 and the adhesion layers 4046*b*.

In the package shown in FIG. 4, both chips have micro bumps formed on their respective substrates. Consistent with embodiments of the present disclosure, a package may also be formed by bonding one chip having micro bumps to another chip without micro bumps. For example, the micro bumps of one chip may be bonded directly to bonding layers of another chip. In other embodiments, a package may also be formed in a face-to-back manner, in which micro bumps on one substrate may be directly bonded to a back surface of another substrate, and then electrically connected to circuits on a top surface of the another substrate via through holes, such as TSVs.

Other embodiments of the present disclosure will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method for forming a micro bump, comprising:
    forming a first nano-particle layer on a substrate, the first nano-particle layer including a plurality of first nano particles;
    forming a second nano-particle layer on the first nano-particle layer, the second nano-particle layer including a plurality of second nano particles; and
    irradiating a laser beam onto the second nano-particle layer, the laser beam penetrating through the second nano-particle layer and being at least partially absorbed by at least some of the first nano particles to melt at least a portion of the first nano particles, ones of the melted first nano particles adhering to ones of the second nano particles,
    wherein the first nano particles and the second nano particles have different absorption rates with respect to the laser beam.

2. The method according to claim 1, further including providing the first nano particles and the second nano particles having different surface plasmon resonance (SPR) wavelengths,
    wherein the irradiating includes irradiating the laser beam with a wavelength close to the SPR wavelength of the first nano particles.

3. The method according to claim 1, wherein forming the first nano-particle layer includes forming the first nano-particle layer to a thickness of about 100 nm to about 1000 nm.

4. The method according to claim 1, further comprising:
    removing unmelted first nano particles and unadhered second nano particles.

5. The method according to claim 1, wherein forming the first nano-particle layer and the second nano-particle layer includes forming the first nano-particle layer and the second nano-particle layer with the first nano particles and the second nano particles formed of different metals.

6. The method according to claim 5,
    wherein forming the first nano-particle layer includes forming the first nano-particle layer with the first nano particles formed of silver or gold, and
    wherein forming the second nano-particle layer includes forming the second nano-particle layer with the second nano particles formed of copper.

7. The method according to claim 1,
    wherein forming the first nano-particle layer and the second nano-particle layer includes forming the first nano-particle layer and the second nano-particle layer with the first nano particles and the second nano particles formed of a same metal, and
    wherein the first nano particles and the second nano particles have different sizes.

8. The method according to claim 7, wherein forming the first nano-particle layer and the second nano-particle layer includes forming the first nano-particle layer and the second nano-particle layer with the first nano particles and the second nano particles formed of copper.

9. The method according to claim 1,
    wherein forming the second nano-particle layer further includes forming the second nano-particle layer including the second nano particles and a plurality of third nano particles, and
    wherein the third nano particles are same nano particles as the first nano particles.

10. A method for forming a micro bump, comprising:
    forming a first nano-particle layer on a substrate, the first nano-particle layer including a plurality of first nano particles;
    patterning the first nano-particle layer to form a plurality of adhesion pads;
    forming a second nano-particle layer directly on the adhesion pads and over the substrate, the second nano-particle layer including a plurality of second nano particles; and
    irradiating a laser beam onto the second nano-particle layer, the laser beam penetrating the second nano-particle layer and being at least partially absorbed by at least some of the first nano particles in the adhesion pads to melt at least a portion of the first nano particles, ones of the melted first nano particles adhering to ones of the second nano particles,
    wherein the first nano particles and the second nano particles have different absorption rates with respect to the laser beam.

11. The method according to claim 10, further comprising:
    removing unadhered second nano particles.

* * * * *